United States Patent [19]

Taniguchi et al.

[11] Patent Number: 4,889,793

[45] Date of Patent: Dec. 26, 1989

[54] PHOTOSENSITIVE POLYMER COMPOSITION CONTAINING AN ETHYLENICALLY UNSATURATED COMPOUND AND A POLYAMIDE OR POLYESTERAMIDE

[75] Inventors: Masaharu Taniguchi, Shiga; Masazumi Tokunou; Junichi Fujikawa, both of Kyoto, all of Japan

[73] Assignee: Toray Industries, Inc., Tokyo, Japan

[21] Appl. No.: 104,208

[22] Filed: Oct. 5, 1987

[30] Foreign Application Priority Data

Dec. 26, 1986 [JP] Japan ................................ 61-308687
May 20, 1987 [JP] Japan ................................ 62-121333

[51] Int. Cl.$^4$ .......................... G03C 1/70; G03C 1/68
[52] U.S. Cl. .................................. 430/284; 430/906; 430/286; 430/287; 430/281; 522/136; 522/137; 522/144; 522/78; 522/93; 522/96; 522/145
[58] Field of Search ............... 430/906, 286, 287, 284, 430/281; 522/136, 137, 144, 78, 93, 96, 145

[56] References Cited

U.S. PATENT DOCUMENTS

| | | | |
|---|---|---|---|
| 3,770,438 | 11/1973 | Celeste | 96/67 |
| 3,850,770 | 11/1974 | Juna et al. | 430/284 |
| 4,144,073 | 3/1979 | Bronstert et al. | 430/906 X |
| 4,198,236 | 4/1980 | Held | 430/306 |
| 4,323,639 | 4/1982 | Chiba et al. | 430/300 X |
| 4,481,280 | 11/1984 | Fujikawa et al. | 430/281 |

FOREIGN PATENT DOCUMENTS

| | | |
|---|---|---|
| 0036301 | 3/1981 | European Pat. Off. . |
| 0038029 | 4/1981 | European Pat. Off. . |
| 0085472 | 1/1983 | European Pat. Off. . |
| 1447932 | 2/1969 | Fed. Rep. of Germany . |
| 2364873 | 12/1972 | Fed. Rep. of Germany . |
| 1177742 | 12/1957 | France . |
| 1063837 | 4/1986 | Japan ................................ 522/144 |
| 1173043 | 12/1969 | United Kingdom ............ 430/906 |
| 1325875 | 8/1973 | United Kingdom ............ 430/307 |

OTHER PUBLICATIONS

Patent Abstracts of Japan, vol. 8, No. 208 (P-302) [1645] (Toray K.K.)

*Primary Examiner*—Paul R. Michl
*Assistant Examiner*—Cynthia Hamilton
*Attorney, Agent, or Firm*—Armstrong, Nikaido, Marmelstein, Kubovcik & Murray

[57] ABSTRACT

The present invention relates to a photosensitive polymer composition comprising the following components A, B and C:

A: 100 parts by weight of ethylenically unsaturated compounds,

B: 3 to 40 parts by weight of a polyamide or 3 to 32 parts by weight of a polyesteramide soluble in the ethylenically unsaturated compounds and C: 0.01 to 10 parts by weight of a photopolymerization initiator, and a solid photosensitive printing plate material comprising the above-mentioned photosensitive polymer composition and a support, which solid photosensitive printing plate material can be easily prepared from a substantially solvent-free starting material and usable for the production of a printing plate, flexible printing plate and flexographic printing plate developable with water and/or an alcohol.

32 Claims, No Drawings

PHOTOSENSITIVE POLYMER COMPOSITION CONTAINING AN ETHYLENICALLY UNSATURATED COMPOUND AND A POLYAMIDE OR POLYESTERAMIDE

BACKGROUND OF THE INVENTION (1) Field of the Invention:

The present invention relates to a photosensitive polymer composition and a master printing plate prepared from this composition.

In particular, the present invention relates to a photosensitive polymer composition having excellent moldability and developability, a master printing plate prepared from this composition and a printing plate having a good ink resistance. Further the present invention relates to a photosensitive master printing plate material usable for the preparation of a flexible printing plate or a flexographic printing plate having excellent moldability and water and/or alcohol developability and a good ink resistance.

(2) Description of the Prior Art:

Photosensitive polymer compositions comprising an ethylenically unsaturated compound and a photopolymerization initiator supported on a carrier polymer such as styrene/butadiene block copolymer, crystalline 1,2-polybutadiene or a polymeric elastomer such as polyurethane are known as photosensitive solid printing plate materials for flexographic printing plates (see, for example, specification U.S. Pat. Nos. 3,674,486, 4,517,278 and 3,024,180).

However, these photosensitive printing plate materials pose problems of injuring of health and environmental pollution, since these materials necessitate a halogenated hydrocarbon such as trichloroethane in the development step. Although a photosensitive polymer material for the flexographic printing plate to which the water developability is imparted has been known as described in Japanese patent publication No. 33884/1983, also this material necessitates development with alkaline water and/or an alcohol under heating. Therefore, the practical value of this material is low because a dangerous operation is required in the development. On the other hand, photosensitive solid printing plate materials for the flexographic printing plates and flexible printing plates which are to be developed with water and/or an alcohol have been proposed. These printing plate materials comprise photographic resin compositions comprising an ethylenically unsaturated compound and a photopolymerization initiator supported on an alcohol-soluble polyamide carrier or a polyesteramide carrier (see, for example, Japanese patent application Kokai publication No. 49-88606 and specification U.S. Pat. No. 4,464,456). However, the printing plates prepared from these materials are not resistant to a water ink, an alcohol ink or the like used in the flexographic printing, though they are resistant to an oil ink (i.e. an ink containing a solvent mainly comprising a hydrocarbon). Though such a photosensitive solid master printing plate has been previously solidified and it can be subjected to the exposure and subsequent processes as it is, its developability, developer selectivity, flexibilization and solvent resistance are yet unsatisfactory. In particular, no practically satisfactory solid material for the photosensitive flexographic printing plates to be developed with water or a mixture of water (main component) and an alcohol has been obtained. On the other hand, it has been known that a liquid photosensitive master printing plate material is inexpensive and has a good developability, particularly water developability, and that it can be used for the preparation of a water ink-resistant flexible printing plate (see, for example, Japanese patent application Kokai publication No. 49-109104) unlike the solid plating plate material. However, it has problems that the exposure step is complicated, that a complicated engraving machine is necessitated and that the plate thickness cannot be controlled precisely.

Now the description will be made as regards not only the flexographic printing plate materials but also general photosensitive solid printing plate materials to be developed with water or an alcohol. Photosensitive solid printing plate materials comprising a polyamide or polyesteramide soluble in water or an organic solvent, particularly an alcohol, as the carrier are known. The amount of the polyamide or polyesteramide in the photosensitive polymer composition in the photosensitive layer is 30 to 95 wt. %, practically 40 to 70 wt. %, as described in, for example, specification U.S. Pat. No. 4,481,280, Japanese patent publication Nos. 26125/1971, 32645/1975 and 28485/1982, Japanese patent application Kokai publication No. 55-79437 and specification U.S. Pat. No. 4,464,456.

SUMMARY OF THE INVENTION

An object of the present invention is to provide a photosensitive polymer composition suitable for use as a photosensitive solid printing plate material having the above-mentioned merits of both liquid printing plate material and solid printing plate material. In particular, the object of the present invention is to provide a photosensitive polymer composition usable as a material for the photosensitive solid printing plates to be developed with water and/or an alcohol, flexible printing plates and flexographic printing plates. Another object of the present invention is to provide a photographic polymer composition capable of forming a flexible printing plate having a Shore A hardness of 20 to 90 which is developable with water or a developer mainly comprising water and which is resistant to various ink solvents such as hydrocarbons, water, alcohols, esters and ketones.

The present invention relates to a photosensitive polymer composition comprising the following components A, B and C:

A: 100 parts by weight of an ethylenically unsaturated compound,

B: 3 to 40 parts by weight of a polyamide soluble in the ethylenically unsaturated compound A or 3 to 32 parts by weight of a polyesteramide soluble in the compound A, and C: 0.01 to 10 parts by weight of a photopolymerization initiator.

The present invention relates also to a photosensitive solid printing plate material comprising this photosensitive polymer composition and a support.

The inventors have found that a large amount of an ethylenically unsaturated compound which is intrinsically liquid or fluid at room temperature can be solidified with a small amount of a polyamide or polyesteramide unexpectedly. The inventors have further found that when this compound is incorporated in a photosensitive polymer composition, a photosensitive solid printing plate material having excellent developability and ink resistance can be obtained. The present invention have been completed on the basis of these findings.

Even when the polyamide or polyesteramide content of the photosensitive polymer composition comprising the organic solvent-soluble polyamide or polyesteramide, an ethylenically unsaturated compound and a photopolymerization initiator as the indispensable components is less than 28 wt. %, further less than 20 wt. % or particularly less than 10 wt. %, the photosensitive solid printing plate material having a sufficient practical strength can be obtained. The photosensitive solid material for the printing plate satisfying the objects of the present invention can be obtained by suitably selecting the components of the composition. Thus, a photosensitive solid printing material for flexographic printing plates developable with water and/or an alcohol can be obtained. Such characteristic properties of the composition of the present invention can be obtained because the polymer component in the composition of the present invention acts as a high-molecular gelling agent and the characters of the ethylenically unsaturated compound used as the main component exert great influences on the characters of the photosensitive solid printing plate material and the printing plate, unlike the ordinary photosensitive polymer composition which contains an alcohol-soluble polyamide or polyesteramide as the carrier polymer, in which the ethylenically unsaturated compound is compatibilized with the polymer and wherein the characters of the polymer exert a great influence on the characters of the photosensitive solid printing plate material and the printing plate. This is the fundamental difference between them. Thus, the characters of the printing plate material obtained from the photosensitive polymer composition of the present invention are utterly different from those of the ordinary printing plate materials. The former has an excellent image-reproducibility and is useful as will be described below in detail.

DESCRIPTION OF THE PREFERRED EMBODIMENTS

The inventors noticed that polyamides or polyesteramides soluble in solvents such as alcohols have a power of gelling the solvents. After investigations of the gelation and solidification of a large amount of an ethylenically unsaturated compound which is liquid or fluid at room temperature with a small amount of a polyamide soluble in the ethylenically unsaturated compound, the inventors have completed the present invention.

The ethylenically unsaturated compounds usable in the present invention are photopolymerizable compounds having a molecular weight of at least 70 and at least one ethylenic double bond in the molecule. Any of known compounds of this type can be used. Examples of them include monoacrylates and monomethacrylates; reaction products of an alkylene glycol with an unsaturated carboxylic acid such as acrylic acid or methacrylic acid; mono- or polyacrylates and mono- or polymethacrylates produced by reacting an unsaturated epoxy compound with a carboxylic acid, unsaturated carboxylic acid or amino acid; mono- or polyacrylamides and mono- or polymethacrylamides; mono- or polyacrylates and mono- or polymethacrylates of urethane or ester oligomers; and polybutadienes and polyisoprenes having a number-average molecular weight of 500 to 20,000 known as liquid rubbers or polyene oligomers and modified liquid rubbers. These examples by no means limit the ethylenically unsaturated compounds.

The ethylenically unsaturated compounds usable in the present invention are not particularly limited and they are suitably selected depending on the characteristics required of the intended moldings or on the kind of the polyamide or polyesteramide used as the polymeric gelling agent. Among them, those which can be combined preferably with the alcohol-soluble polyamide or polyesteramide to obtain the printing plate material developable with water and/or an alcohol so as to satisfy the main object of the present invention include those having at least one hydroxyl group in the molecule and a hydroxyl equivalent in the range of 50 to 400. Examples of them include epichlorohydrin-modified bisphenol A diacrylate of the formula:

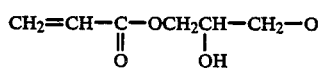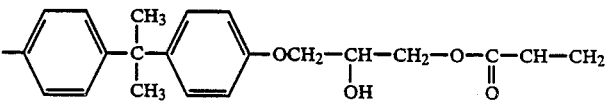

epichlorohydrin-modified bisphenol A dimethacrylate [hereinafter these acrylates and methacrylates will be referred to collectively as (meth)acrylates], caprolactone-modified 2-hydroxyethyl (meth)acrylate, propylene oxide/epichlorohydrin-modified di(meth)acrylate, epichlorohydrin-modified butyl (meth)acrylate, 3-chloro-2-hydroxypropyl (meth)acrylate, epichlorohydrin-modified diethylene glycol di(meth)acrylate, epichlorohydrin-modified ethylene glycol di(meth)acrylate, glycerol di(meth)acrylate, epichlorohydrin-modified glycerol tri(meth)acrylate, epichlorohydrin-modified 1,6-hexanediol (meth)acrylate, 2-hydroxyethyl (meth)acrylate, caprolactone-modified 2-hydroxypropyl (meth)acrylate, 2-hydroxy-3-(meth)acryloxypropyl-trimethylammonium chloride, 2-hydroxypropyl (meth)acrylate, epichlorohydrin-modified phenoxy (meth)acrylate, ethylene oxide-modified (meth)acrylates such as β-hydroxyethyl β'-(meth)acryloyloxyethyl phthalate, epichlorohydrin-modified di(meth)acrylate, ethylene oxide/propylene oxide-modified phthaloyl (meth)acrylate, polyethylene glycol (meth)acrylate, polypropylene glycol (meth)acrylate and epichlorohydrinmodified propylene glycol di(meth)acrylate. These examples by no means limit the ethylenically unsaturated compounds usable in the present invention. Urethane (meth)acrylates and (meth)acrylamides having a hydroxyl equivalent in the range of 50 to 400 can be used widely as the ethylenically unsaturated compounds. They can be used either singly or in the form of a mixture of two or more of them or a mixture with other ethylenically unsaturated compounds.

A hydroxyl equivalent of the ethylenically unsaturated compound in this range is preferred, since the ethylenically unsaturated compound having such a hydroxyl equivalent is highly compatible with the alcohol-soluble polyamide or polyesteramide and can be solidified by a small amount of the polyamide or polyesteramide to develop an excellent solid state at room temperature. From this viewpoint, it is preferred that the ethylenically unsaturated compounds in the composition of the present invention include those having a hydroxyl equivalent of 150 to 350.

The ethylenically unsaturated compounds preferably used in combination with the alcohol-soluble polyamide or polyesteramide include those having at least one amide structure in the molecule and also having an amide equivalent of 50 to 400 and a molecular weight of 70 to 500. Examples of them include N,N-dimethyl(meth)acrylamide, (meth)acryloylmorpholine, N-methyl(meth)acrylamide, N,N-dimethylaminopropyl(meth)acrylamide, N-methylol ether compounds prepared from (meth)acrylamide and an alcohol or diol having 1 to 8 carbon atoms and bisglycol ether compounds of N-methylolacrylamide. These examples by no means limit the compounds.

Though the amount of the ethylenically unsaturated compound having at least one hydroxyl group or amide structure in the molecule and preferably used in combination with the alcohol-soluble polyamide or polyesteramide is not particularly limited, it is 5 to 100 wt. %, preferably 30 to 100 wt. %, based on the total ethylenically unsaturated compounds.

To prepare a solid flexible printing plate material developable with water and/or an alcohol which is one of the objects of the present invention, a mono(meth)acrylate i preferably used as the main ethylenically unsaturated compound. The amount thereof is 10 to 100 wt. %, preferably 50 to 90 wt. %, based on the total ethylenically unsaturated compounds.

The structure of the mono(meth)acrylate is suitably selected depending on the structure of the polyamide or polyesteramide used as the polymeric gelling agent. Particularly, compounds of the following formulae can be preferably combined with the alcohol-soluble polyamide or polyesteramide:

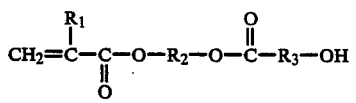

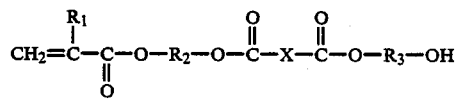

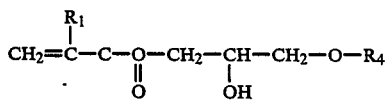

wherein $R_1$ represents H or $CH_3$, $R_2$ represents

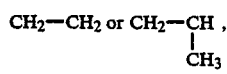

$R_3$ represents an alkylene group having 2 to 6 carbon atoms, $R_4$ represents an alkyl group having 4 to 14 carbon atoms or a phenyl group which is either unsubstituted or substituted with an alkyl group having 1 to 8 carbon atoms, and X represents a dicarboxylic acid residue having 4 to 12 carbon atoms.

The compounds of the above general formulae are used either alone or in the form of a mixture thereof with any of other known ethylenically unsaturated compounds selected depending on the purpose, such as mono or polyvalent (meth)acrylates prepared by reacting (meth)acrylic acid with an alcohol, a (meth)acrylamide, N-methylol(meth)acrylamide, diacetone(meth)acrylamide, methylenebis(meth)acrylamide, mono or polyvalent (meth)acrylamides prepared by condensing N-methylol(meth)acrylamide with an alcohol and vinyl compounds such as divinylbenzene.

Though oligomers having a double bond in the molecule can be used alone as the ethylenically unsaturated compounds in the present invention, the solubility of the polyamide or polyesteramide used as the polymeric gelling agent therein is limited. Therefore, to obtain the flexible or flexographic printing plate developable with water and/or an alcohol which is the main object of the present invention, it is preferred and effective to use the oligomer in the form of a mixture thereof with an ethylenically unsaturated compound having a hydroxyl group or amide structure in the molecule and a molecular weight of 70 to 500.

In particular, the use of the ethylenically unsaturated compound in combination with a polyene such as a polybutadiene having a molecular weight of 500 to 5,000 known as a liquid rubber or its copolymers or modifications or a polyisoprene having a molecular weight of 500 to 20,000 or its copolymers or modifications is effective in imparting excellent flexibility, rubber elasticity, strength and elongation and polar solvent resistance to the moldings prepared from the photosensitive polymer composition of the present invention. The term "modifications" as used herein refers to maleic anhydride-modified derivatives, epoxidized derivatives, carboxylated derivatives, sulfonated derivatives products and (meth)acryloylated derivatives of the polyenes prepared by taking advantage of the reactivity of the main chain, side chain or terminal group of the polyenes as well as their derivatives prepared by taking advantage of the reactivity of these modifications.

It is also effective to use the ethylenically unsaturated compound in combination with a monovalent or polyvalent (meth)acrylate of an oligomer having a molecular weight of 500 to 5,000 prepared by bonding a polyol or polyesterdiol with a polyvalent isocyanate [hereinafter referred to as oligomer urethane (meth)acrylates] for imparting the flexibility and rubber elasticity to the moldings. In regard to the flexibility, rubber elasticity and water or alcohol developability, the amount of the polyene or oligomer urethane (meth)acrylate is preferably 1 to 70 wt. %, more preferably 3 to 50 wt. %.

In addition, polyester oligomer mono- or poly(meth)acrylates and polyether oligomer mono- or poly(meth)acrylates can also be used depending on the use.

The ethylenically unsaturated compounds may have a carboxylic acid/amine salt or sulfonic acid/amine salt bond in the molecule.

Among the ethylenically unsaturated compounds, those having one or more substituted or unsubstituted benzene nucleus structures in the molecule are particularly effective in improving the solvent resistance of the moldings, particularly printing plates, prepared from the photosensitive polymer composition of the present invention.

Examples of such ethylenically unsaturated compounds include β-hydroxyethyl β'-acryloyloxyethyl phthalate, ethylene oxide-modified phthaloyl (meth)acrylates such as ethylene oxide adduct of this compound, epichlorohydrin-modified phenol (meth)acrylates of the following formula prepared by reacting phenyl glycidyl ether with (meth)acrylic acid:

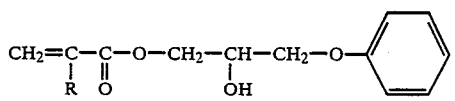

wherein R represents H or CH₃, epichlorohydrin-modified bisphenol A di(meth)acrylate and ethylene oxide/propylene oxide-modified phthaloyl(meth)acrylate. Further oligomer urethane mono(meth)acrylates and oligomer urethane di(meth)acrylates having a substituted or unsubstituted benzene nucleus structure in the molecule are effectively usable with regard to the compatibility thereof and also ink resistance, flexibility and rubber elasticity of the printing plates prepared from them. Among these ethylenically unsaturated compounds, those mainly comprising mono(meth)acrylates having a substituted or unsubstituted benzene nucleus structure in the molecule are particularly preferably used.

The amount of the ethylenically unsaturated compounds having a substituted or unsubstituted benzene nucleus structure in the molecule is preferably at least 50 wt. % more preferably at least 70 wt. %, based on the total ethylenically unsaturated compounds in the photosensitive resin composition of the present invention.

The polyamides or polyesteramides soluble in the ethylenically unsaturated compounds and effective as a polymeric gelling agent are those soluble in the ethylenically unsaturated compounds or mixtures of the ethylenically unsaturated compound and a plasticizer which will be described below at a temperature in the range of room temperature to 200° C. The polyamides include those soluble in the ethylenically unsaturated compounds and prepared by polycondensing a lactam having 5 to 13 ring atoms and/or aminocarboxylic acids constituting the lactam and/or diamine/dicarboxylic acid salts and modifications thereof such as N-alkoxymethylated polyamides. The starting materials for the polyamides include lactams such as caprolactam, enantholactam, caprylolactam, laurolactam, methyl-ϵ-caprolactam, ethyl-ϵ-caprolactam and ethylenantholactam; diamines such as pentamethylenediamine, hexamethylenediamine, heptamethylenediamine, octamethylenediamin and C- or N-substituted derivatives of these amines, e.g. N-methyl or N-ethyl-hexamethylenediamine and 1,6-diamino-3-methylhexane, alicyclic diamines, e.g. 1,4-diaminocyclohexane and p,p'-bis(4-aminocyclohexyl)methane, aromatic diamines, e.g. m-phenylenediamine, m-xylylenediamine and 4,4'-diaminodiphenylmethane, αω-diaminopropylpolyoxyethylene, N,N'-dimethyl-N,N'-bis(3-aminopropyl)ethylenediamine, N-bis(2-aminoethyl)methylamine and bis(aminopropyl)piperazine.

Examples of the dicarboxylic acids include succinic, adipic, sebacic, dodecanedicarboxylic, succinic and dimer acids as well as corresponding substituted derivatives such as αα-diethyladipic acid, α-ethylsuccinic acid and ω,ω'-octane- or nonanedicarboxylic acid; dicarboxylic acids having an alicyclic ring, such as 1,4-cyclohexanedicarboxylic acid, 1,2-cyclohexanedicarboxylic acid, dicyclohexyl-4,4'-dicarboxylic acid and methylhimic acid; dicarboxylic acids having an aromatic ring, such as terephthalic acid, isophthalic acid, phthalic acid, naphthalene-2,6-dicarboxylic acid, naphthalene-2,7-dicarboxylic acid, diphenyl-4,4'-dicarboxylic acid, diphenoxyethanedicarboxylic acid and sodium 5-sulfoisophthalate. The amount of the polyamide used as the polymeric gelling agent is 3 to 40 parts by weight, preferably 4 to 35 parts by weight and more preferably 5 to 30 parts by weight, for 100 parts by weight of the ethylenically unsaturated compound in the photosensitive polymer composition of the present invention.

When the amount of the polyamide exceeds 40 parts by weight, the workability of the composition is reduced and, in addition, the printing plate material prepared from the composition of the present invention has a reduced developability and the printing plate has an insufficient resistance to a water ink or alcohol ink. When the amount is less than 3 parts by weight, on the contrary, the shape retentivity of the solid printing plate material is insufficient unfavorably.

The polyesteramides are those having an ester bond and an amide bond in the main chain and soluble in the ethylenically unsaturated compound in the composition of the present invention. They are selected from the group consisting of polyesteramides prepared by polycondensing a diol/dicarboxylic acid forming the polyester block with a lactam having 5 to 13 ring atoms and/or an aminocarboxylic acid constituting the lactam and/or a diamine/dicarboxylic acid salt and modifications of them.

Preferred examples of the diols used as the starting material for the polyesteramides include polyethylene glycol, poly(1,2-propylene oxide) glycol, poly(1,3-propylene oxide) glycol, poly(tetramethylene oxide) glycol, poly(hexamethylene oxide) glycol and block or random copolymers of ethylene oxide and propylene oxide. Further alkylene glycols and their C-substituted derivatives can also be used. The dicarboxylic acids, lactams, aminocarboxylic acids and diamines usable in the present invention are the same as those described above as the starting materials for the polyamides.

The polyesteramides prepared by introducing an ester bond into the main chain of polyamides usually form block copolymers. The amount of the polyester block in the polyesteramide used in the composition of the present invention is preferably 30 to 90 wt. %, more preferably 40 to 80 wt. %.

By introducing the ester bond, the workability of the composition of the present invention and the characters of the moldings are modified. When the polyesteramide is used as the polymeric gelling agent, the moldings having a more excellent shape retentivity than that of the polyamide can be obtained even if the amount of the former is less than that of the latter. By using the polyesteramide according to the present invention, the components of the composition can be selected over a wide range and, therefore, the moldings having more excellent properties such as mechanical properties and solvent resistance can be obtained advantageously.

The amount of the polyesteramide used as the polymeric gelling agent is 3 to 32 parts by weight, preferably 3 to 27 parts by weight and more preferably 3 to 22 parts by weight, for 100 parts by weight of the ethylenically unsaturated compounds in the photosensitive polymer composition of the present invention for the same reasons as those described above with reference to the polyamide.

The polyamide or polyesteramide soluble in the ethylenically unsaturated compounds used in the present invention is not particularly limited. It is selected from the group consisting of the polyamides and polyesteramides soluble in the ethylenically unsaturated compounds used and having a number-average molecular weight of preferably at least 3,000, more preferably at least 5,000. For preparing the printing plate material developable with water and/or an alcohol to attain the main object of the present invention, it is preferred that the polyamide or polyesteramide is alcohol-soluble. The term "alcohol-soluble polyamides and polyesteramides" as used herein refers to the polyamides and polyesteramides soluble in an alcohol having 1 to 18 carbon atoms, a mixture of at least 50 wt. % of such an alcohol and the balance of water or a mixture of such an amount of the alcohol and the balance of an ester at room temperature or under heating. Among the alcohol-soluble polyamides and polyesteramides, particularly preferred are N-alkoxymethylated polyamides, N-alkoxymethylated polyesteramides, polyether amides having a polyether block structure and polyether esteramides.

For improving the solvent resistance of the moldings, particularly printing plates, prepared from the photosensitive polymer composition of the present invention, it is effective that at least a part of the polyamide or polyesteramide has a substituted or unsubstituted benzene nucleus structure in the molecule. Preferably at least 30 wt. %, more preferably at least 50 wt. %, of the polyamides or polyesteramides have such a benzene nucleus structure. The polyamides and polyesteramides suitable for this purpose include, for example, polyamides, polyetheramides, polyesteramides, polyetheresteramides, N-alkoxymethylated amides and polyaminamides prepared from o-phthalic acid, m-phthalic acid (isophthalic acid), p-phthalic acid (terephthalic acid), m-xylenediamine, m-phenylenediamine, 4,4'-diaminodiphenyl ether, 4,4'-diaminodiphenylmethane and derivatives of them having a substituted or unsubstituted benzene nucleus structure. Among them, polyetheramides and polyetheresteramides are practically preferably used. The combination of the polyamide or polyesteramide having the substituted or unsubstituted benzene nucleus structure in the main chain with the ethylenically unsaturated compound having the substituted or unsubstituted benzene nucleus structure in the molecule is effective in improving the solvent resistance, particularly resistance to an alcohol or ester, of the printing plates prepared from the photosensitive polymer composition of the present invention.

The photopolymerization initiators usable for rapidly conducting the photopolymerization of the composition of the present invention include all of known compounds such as benzoin alkyl ethers, benzophenones, anthraquinones, benzils, acetophenones and diacetyls. These photopolymerization initiators are usually used in an amount in the range of 0.01 to 10 wt. % based on the total composition.

A plasticizer can be added to the photosensitive polymer composition of the present invention to make it possible to widen the selectivity of the printing plate material toward the developers and to obtain moldings having a high flexibility, particularly a super-flexibility. The plasticizers usable for this purpose include various low-molecular and high-molecular plasticizers compatible with the composition of the present invention. Examples of them include glycerol, alkylene glycols, polyalkylene glycols, (meth)acrylate oligomers, N,N-dialkylbenzenesulfonamides, phosphoric esters, phthalic esters, polyamide oligomers and polyamine oligomers. The plasticizers are not limited to these compounds and various ones can be used depending on the purposes.

When the flexible printing plate developable with water is intended, it is effective to use particularly glycerol, an alkylene glycol or its derivative. For improving the solvent resistance of the printing plate, a plasticizer comprising a compound having at least one benzene nucleus structure in the molecule is effective (as a matter of course, such a plasticizer is a compound having no ethylenical double bond).

The amount of the plasticizer in the photosensitive polymer composition of the present invention is usually less than 50 parts by weight, preferably less than 30 parts by weight, for 100 parts by weight of the ethylenically unsaturated compound in the photosensitive polymer composition, since when it is used in an excess amount, the image-reproducibility and ink resistance of the final moldings are reduced. However, when a plasticizer having a molecular weight of as high as 700 or above is used, the amount thereof may be further increased, if necessary.

The plasticizer used in the present invention essentially contributes to the flexibilization of the moldings. Particularly for the production of flexographic printing plates, it is effective that at least a part of the plasticizers comprises a compound having at least one tertiary amine linkage and at least one hydroxyl group in the molecule. Such a special structure is effective in producing water and/or alcohol-developable, highly sensitive solid printing plate materials from the photosensitive polymer composition of the present invention and flexible or flexographic printing plates having an excellent image-reproducibility. As such a plasticizer, an addition reaction product of a compound having at least one primary or secondary amino group in the molecule, a compound having at least one acryloyl group in the molecule and/or a compound having at least one glycidyl group is particularly preferably used. Examples of the addition reaction products include those of m-xylylenediamine and an alkyl glycidyl ether having 1 to 20 carbon atoms in a molar ratio of 1:4, a Michael addition reaction product of m-xylylenediamine and β-hydroxyethyl β'-acryloyloxyethyl phthalate in a molar ratio of 1:4, and reaction products of m-xylylenediamine, an alkyl glycidyl ether having 1 to 20 carbon atoms and β-hydroxyethyl β'-acryloyloxyethyl phthalate in a molar ratio of 1:2:2. Any plasticizer compatible with the ethylenically unsaturated compounds in the composition of the present invention can be used.

To improve the solvent extraction resistance of the final moldings, the plasticizer has a number-average molecular weight of preferably 300 to 5,000 and more preferably 700 to 4,000 or higher.

Further saturated or unsaturated polymers such as polyesters, polyurethanes, polyethers and copolymers of them can be added to the composition so as to improve the shape retentivity of the printing plate material comprising the photosensitive polymer composition of the present invention and the chemical resistance of the moldings.

When a higher sensitivity is required of the photosensitive polymer composition of the present invention, it is preferred that the composition contains an addition reaction product of an ethylenically unsaturated compound having at least one tertiary amine linkage or its salt form and at least one hydroxyl group in the molecule, such as an addition reaction product of m-xylylenediamine, 2-ethylhexyl acrylate, glycidyl methacrylate and butyl glycidyl ether in a molar ratio of 1:2:1:1 or an addition reaction product of diethanolamine and butyl glycidyl ether. It is particularly preferred that at least a part of the ethylenically unsaturated compounds comprise such a compound.

Any of known polymerization inhibitors can be used in order to improve the thermal stability of the photosensitive polymer composition of the present invention. Examples of preferred polymerization inhibitors include phenols, hydroquinones and catechols. The amount of the thermal stabilizer used is in the range of 0.001 to 5 wt. % based on the total composition. Further, a dye, pigment, surfactant, antifoaming agent, U.V. absorber, flavor, etc. can be added to the composition.

Other characteristic features of the photosensitive polymer composition of the present invention are that the amount of the polyamide or polyesteramide used is usually small and that the additives including photo-induced reaction components can be selected over a wide range because of the high compatibility thereof.

When the photosensitive polymer composition of the present invention is used as the material for a printing plate used for the printing with an alcohol ink or a solvent ink containing, for example, ethyl acetate, it is effective that at least 50 wt. %, preferably at least 60 wt. % and more preferably at least 70 wt. %, of the total components constituting the photosensitive polymer composition comprises a compound having a substituted or unsubstituted benzene nucleus structure.

An example of processes for producing the photosensitive polymer composition of the present invention comprises adding the polymer such as the polyamide or polyesteramide to the ethylenically unsaturated compound in the form of a mixture thereof with liquid additives such as the heat stabilizer and plasticizer, heating the mixture to 80° to 200° C., preferably 100° to 180° C., under stirring to dissolve the polymer, and then dissolving other additives such as the photopolymerization initiator therein to obtain a substantially solvent-free solution. The solution is cast, spread or cooled to directly obtain the moldings.

The photosensitive polymer composition of the present invention is characterized in that it substantially comprises a heat-reversible gel. Namely, it is in the form of a solid having a sufficient practical strength at room temperature while it is in the form of a liquid having a relatively low viscosity under heating. The photosensitive polymer composition can be, therefore, molded by an easy molding method in virtue of this property.

The photosensitive polymer composition of the present invention can be designed so that it is in the form of a liquid having a viscosity of 1,000 P or lower at 150° C. and 1,000 P or lower at 100° C.

A printing plate can be formed from the photosensitive polymer composition of the present invention by, for example, directly spreading a solution of the composition on a support.

Although a dry film-forming method may be employed in case a solvent must be used, usually an intended photosensitive sheet can be prepared by merely cooling, since molding is conducted without using any solvent. Thick sheets can also be produced easily by this method.

Metal plates such as steel, stainless steel, aluminum or copper plate having, if necessary, an adhesive layer, plastic sheets such as polyester film, and synthetic rubber sheets are used as the support. The photosensitive layer is formed thereon usually in a thickness of 0.1 to 10 mm.

A printing relief image can be formed from the photosensitive polymer composition of the present invention by contacting a negative or positive film of an original on the photosensitive layer and exposing it to ultraviolet rays of mainly 300 to 400 mμ by using a high-pressure mercury lamp, a metal halide lamp, a xenon lamp, a carbon arc lamp or a chemical lamp to cure it by a photo-induced reaction. Then non-cured parts are dissolved in a solvent by means of a spray developing device or a brush developing device to form a relief on the support.

The photosensitive polymer composition of the present invention is characterized in that it is prepared by modifying a composition which is liquid or nearly liquid at room temperature so that it can be handled as a solid at room temperature. Therefore, this composition is usable as a solid printing plate material for flexible printing plates, flexographic printing plates, etc. The effects of the composition is exhibited most remarkably when it is used as a relief printing plate material and it is usable also as a material for lithographic printing plates, stencil printing plates and photoresists. When the printing plate material prepared from the photosensitive polymer composition of the present invention is used for the preparation of the above-mentioned printing plates or photoresists, an excellent developability is exhibited in the development using a suitable developer selected depending on the composition, since the amount of the carrier polymer contained therein is very small. Another characteristic feature of the composition is, therefore, that the developer can be selected over a wide range. For example, when the same polyamide as a binder base resin in an ordinary printing plate material which is to be developed with an alcohol or a developer mainly comprising an alcohol is incorporated in the photosensitive polymer composition of the present invention, the development can be conducted easily with water or a developer mainly comprising water. Further, a super-flexible plate which could not be prepared when an alcohol-soluble polyamide was used as the binder base resin in the prior art can be obtained.

When the components of the photosensitive polymer composition of the present invention are suitably selected, a flexographic printing plate developable with water and/or an alcohol and for which an oil, alcohol, water or ester solvent ink is usable can be obtained.

The following examples will further illustrate the present invention, in which parts are given by weight.

EXAMPLE 1.

20 parts of N-methoxymethylated polyamide having a methoxymethylation rate of 28% prepared by N-methoxymethylating a polyamide resin ["Nylon CM 1041" (nylon-6); a product of Toray Industries, Inc.] by a known method was added to a mixture of 50 parts of a caprolactone-modified 2-hydroxyethyl acrylate of the following formula and 20 parts of 2-hydroxyethyl acrylate:

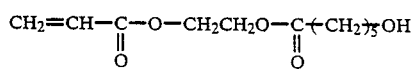

The obtained mixture was heated at 135° C. under stirring to obtain a solution. 0.05 part of hydroquinone as the heat stabilizer and 1.5 parts of benzil dimethyl ketal as the photopolymerization initiator were added to the solution to obtain a homogeneous solution having a viscosity of 115 P at 120° C. The solution was spread over a polyester film substrate having a thickness of 130 μ, to which a polyester adhesive had been applied and cured previously, to form a photosensitive layer having a thickness of 1500 μ. The product was left to stand at room temperature to obtain a solid photosensitive printing plate material.

A gray-scale negative film for the photosensitivity determination (21 Steps Sensitivity Guide; a product of Stouffer Co.) and a negative film for the image-reproducibility test (150 lines, 3%, 5% and 10% halftone dots; diameter of independent dots: 200 μ and 300 μ, width of fine lines: 50 μ and 70 μ) were vacuum-adhered to the photosensitive layer of the printing plate material, and then exposed to a light from a chemical lamp for 7 min.

After completion of the exposure, the development was conducted with a brush-type developing apparatus containing neutral water (water temperature: 30° C.). After the development for 1 min and 20 sec, a relief image having a depth of 1,000 μ was formed.

The obtained relief image was examined to reveal that up to 15 steps remained in the gray-scale portion and that 5% halftone dots, 200 μ independent dots and 50 μ fine lines were completely reproduced in the printing area. The obtained plate had a Shore D hardness of 20. It was a water-developable flexible plate. A printing plate was prepared from this material and subjected to printing tests with an oil ink to obtain excellent prints.

COMPARATIVE EXAMPLE 1

40 parts of the same N-methoxymethylated polyamide as in Example 1 was dissolved in a mixture of 80 parts of ethanol and 20 parts of water under heating. 40 parts of caprolactone-modified 2-hydroxyethyl acrylate, 20 parts of 2-hydroxyethyl acrylate, 0.05 part of hydroquinone and 1.5 parts of benzil dimethyl ketal were dissolved in the solution. A photosensitive printing plate material was prepared from the solution by the dry film-forming method. It could hardly been developed with neutral water, since the amount of the polyamide used was too large.

EXAMPLE 2

55 parts of an equimolar salt of αω-diaminopolyoxyethylene (obtained by adding acrylonitrile to both ends of a polyoxyethylene having a number-average molecular weight of 600 and reducing the product with hydrogen) with adipic acid, 25 parts of ε-caprolactam and 20 parts of a salt of hexamethylene-diamine and adipic acid were melt-polymerized under ordinary conditions to obtain a polyamide having a relative viscosity of 2.50 (determined by dissolving 1 g of the polymer in 100 ml of chloral hydrate and measuring the viscosity of the solution at 25° C.). The polyamide thus obtained was mixed with 0.03 part of hydroquinone as the heat stabilizer, 50 parts of caprolactone-modified 2-hydroxyethyl methacrylate and 30 parts of ethylene oxide-modified phthaloyl acrylate of the following formula:

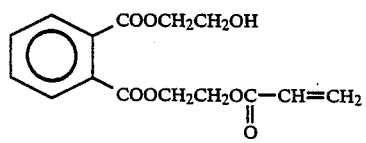

The mixture was heated at 140° C. under stirring to obtain a solution.

1.5 parts of benzil methyl ketal was dissolved in the solution to obtain a solution having a viscosity of 65 P at 120° C. This product was molded in the same manner as in Example 1 to obtain a solid photosensitive printing plate material having a photosensitive layer having a thickness of 1500 μ.

The same negative film as in Example 1 was vacuum-adhered to the material. After exposure to a light from a high-pressure mercury lamp for 3 min, the development was conducted with a brush-type developing apparatus containing neutral water (water temperature: 30° C.). After the development for 1 min, a relief image having a depth of 1 000 μ was obtained.

The obtained relief image was examined to reveal that up to 14 steps remained in the gray-scale portion and that an excellent reproducibility was attained in the printing area. The obtained plate had a Shore D hardness of 30. In the printing tests with a water ink ("Flexo Suisei"; a product of Osaka Insatsu Ink Seizo Co., Ltd.), it exhibited a sufficient plate wear and excellent prints were obtained.

COMPARATIVE EXAMPLE 2

A printing plate material was prepared by dry film-forming method in the same manner as in Example 2 except that the amounts of the polyamide and caprolactone-modified 2-hydroxyethyl methacrylate were 50 parts and 20 parts, respectively. A printing plate was prepared from this material and subjected to the printing test in the same manner as in Example 2. Soon after the start of the printing tests, the printing plate was swollen with the water ink to make the printing impossible.

EXAMPLE 3

A printing plate material was prepared in the same manner as in Example 2 except that 20 parts of the polyamide was replaced with 20 parts of the same N-methoxymethylated polyamide as in Example 1. The plate was exposed in the same manner as in Example 2 and then developed with a mixture of water and ethanol (70 parts/30 parts). The product thus obtained has a gray-scale sensitivity of 16 steps, an excellent reproducibility in the printing area and a Shore D hardness of 28. The printing plate was subjected to the printing tests with a water ink to reveal that it had a sufficient plate wear and excellent prints were obtained.

COMPARATIVE EXAMPLE 3

A printing plate was prepared from the printing plate material prepared in Comparative Example 1 by development with 100% alcohol. In the printing tests, it was swollen with the ink and excellent prints could not be obtained.

EXAMPLE 4

The same procedure as in Example 3 was repeated except that 25 parts of ethylene oxide-modified phthaloyl acrylate was used and that 5 parts of an oligomer urethane acrylate ("Goselac UV 3000 B"; a product of the Nippon Synthetic Chemical Industry Co., Ltd.) was added to obtain a printing plate material, from which a printing plate having an excellent image reproducibility was prepared in the same manner as in Example 3. The printing plate had excellent strength and elongation and a remarkable effect of imparting the rubber elasticity. Further, the plate had a Shore D hardness of 22 and an excellent plate wear.

EXAMPLE 5

A printing plate material and then a printing plate were prepared in the same manner as in Example 4 except that 5 parts of the oligomer urethane acrylate was replaced with 5 parts of trimethylolpropane triacrylate. The plate had a Shore D hardness of 35. The strengths of the printing plate material and the plate were slightly lower than those obtained in Example 3 but the plate wear was almost equal to that of the printing plate prepared in Example 3.

EXAMPLE 6

20 parts of the N-methoxymethylated polyamide prepared in Example 1 was dissolved in a mixture of 65 parts of caprolactone-modified 2-hydroxyethyl methacrylate, 14 parts of diethylene glycol as the plasticizer and 0.05 part of hydroquinone under stirring and under heating at 140° C. 1.0 part of benzil dimethyl ketal was dissolved therein. The solution was spread on the same support as in Example 1 and cooled to obtain a photosensitive printing plate material having a water developability. After the exposure followed by the development conducted in the same manner as in Example 3, a printing plate having an excellent image reproducibility was obtained. This product was a super-flexible plate having a Shore A hardness of 46 and an excellent plate wear.

EXAMPLE 7

40 parts of ε-caprolactam was melt-polycondensed with 60 parts of an equimolar mixture of polyethylene glycol having a number-average molecular weight of 600 and terephthalic acid to obtain a polyether esteramide having a softening point of 185° C. and a relative viscosity (determined by dissolving 0.5 g of the polymer in 100 ml of o-chlorophenol and examined at 25° C.) of 2.10.

15 parts of the polyether esteramide was mixed with 75 parts of an ethylene oxide-modified phthaloyl acrylate of the formula:

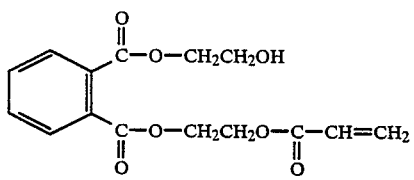

10 parts of an oligomer urethane diacrylate ("UV-2000 B"; a yellowing-type product of Nippon Synthetic Chemical Industry Co., Ltd. comprising tolylene diisocyanate as the base) and 0.05 part of hydroquinone under stirring at 160° C. 1.5 parts of dimethyl benzil ketal was dissolved in the solution to obtain a solution having a viscosity of 400 P at 140° C. The solution was spread on a polyester film substrate, to which a polyester adhesive had been applied and cured to form a film having a thickness of 130 μ, so as to form a photosensitive layer having a thickness of 1500 μ. The product was left to stand at room temperature to obtain a solid photosensitive printing plate material.

The same gray-scale negative film for the photosensitivity determination and negative film for the image-reproducibility test as in Example 1 were vacuum-adhered to the photosensitive layer of the printing plate material. It was exposed to a light from a 2-kW ultra-high pressure mercury lamp (a product of Ohk Seisaku-sho) for 3 min.

After completion of the exposure, the development was conducted with a brush-type developing apparatus containing a developer comprising a mixture of water and ethanol (75:25) (temperature: 30° C.). After the development for 3 min, a relief image having a depth of 1,000 μ was obtained.

The obtained relief image was examined to reveal that up to 15 steps remained in the gray-scale portion and that 5% halftone dots, 200 μ independent dots and 50 μ fine lines were completely reproduced in the printing area. This product was a water-developable flexible plate having a Shore A hardness of 75.

30×30 mm² sample pieces cut out of a solid portion of the plate were subjected to swelling tests in which the pieces were immersed in various solvents at 23° C. for 24 h. The degrees of swelling were 8.1 wt. % in the immersion in water of pH 8, 8.2 wt. % in the immersion in butyl cellosolve/sodium carbonate/water (weight ratio: 4/1/95) corresponding to water ink, 4.6 wt. % in the immersion in ethanol and 10.9 wt. % in the immersion in ethanol/ethyl acetate (weight ratio: 70/30). These results suggested that the product was quite stable to these solvents. It was found that the components constituting the printing plate material were hardly extracted in these immersion tests.

The printing plate was subjected to practical printing tests with a water ink, alcohol ink and oil ink. With any of these inks, 50,000 excellent prints could be obtained.

The water ink used herein was "Flexo Suisei" (a product of Osaka Insatsu Ink Seizo Co., Ltd.) and the alcohol ink was a sample made on an experimental basis by Toray Industries, Inc. and having the following composition:

| non-volatile components | 28.5 wt. % |
|---|---|
| industrial ethanol | 45 wt. % |
| isopropanol | 26.5 wt. % |

The oil ink was a printing ink comprising a hydrocarbon solvent usually used for the relief printing ("Printing Ink"; a product of Sakata Shokai Co., Ltd.).

And, also, in polyester film printing tests of the printing plate with a solvent ink ("Millpack R F801 Black"; a product of Dainippon Ink Chemicals, Inc.), excellent prints could be obtained.

EXAMPLES 8, 9, 10, 11 AND 12

The following additives (A) to (D) were prepared as both photosensitivity improver and plasticizer and the following additive (E) was prepared as both photosensitivity improver and ethylenically unsaturated compound:

(A) compound prepared by addition reaction of 136 parts (1 mol) of m-xylylenediamine and 520 parts (4 mol) of n-butyl glycidyl ether, (B) compound prepared by addition reaction of 136 parts (1 mol) of m-xylylenediamine, 616 parts (2 mol) of ethylene oxide-modified phthaloyl acrylate and 372 parts (2 mol) of 2-ethylhexyl glycidyl ether, (C) compound prepared by addition reaction of 136 parts (1 mol) of m-xylylenediamine and 1232 parts (4 mol) of ethylene oxide-modified phthaloyl acrylate, (D) compound prepared by addition reaction of 296 parts (1 mol) of 1,1,1-trimethylolpropane triacrylate and 408 parts (3 mol) of m-xylylenediamine followed by addition reaction of the product with 2772 parts (9 mol) of ethylene oxide-modified phthaloyl acrylate, and (E) compound prepared by addition reaction of 136 parts (1 mol) of m-xylylenediamine, 616 parts (2 mol) of ethylene oxide-modified phthaloyl acrylate, 186 parts (1 mol) of 2-ethylhexyl glycidyl ether and 142 parts (1 mol) of glycidyl methacrylate.

A printing plate material was prepared in the same manner as in Example 7 except that the amount of the ethylene oxide-modified phthaloyl acrylate was 70 parts and that 5 parts of the above-mentioned compound (A), (B), (C), (D) or (E) was added.

As compared with the printing plate material prepared in Example 7, the material prepared as above had a higher photocuring sensitivity and the exposure time could be reduced to about 2/3. Further, the latter had an improved image reproducibility and particularly remarkably improved transparent image depth.

EXAMPLE 13

A printing plate was prepared in the same manner as in Example 7 except that the amount of ethylene oxide-modified phthaloyl acrylate was 45 parts and that 30 parts of an acrylate of the following formula was added:

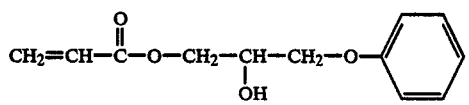

The printing plate had nearly the same characters as those of the product prepared in Example 7.

EXAMPLE 14

A printing plate material was prepared in the same manner as in Example 7 except that the amount of ethylene oxide-modified phthaloyl acrylate was 50 parts and that 25 parts of the compound (B) as used in Example 9 was used.

A printing plate prepared from this material had a gray-scale sensitivity higher than that in Example 7 by 3 steps and a Shore A hardness of 55. In the printing tests of the plate with an alcohol ink, excellent prints were obtained. This fact indicated that the plate was an excellent flexographic printing plate.

EXAMPLE 15

9 parts of the same polyether esteramide as in Example 7 was added to a mixture of 45 parts of ethylene oxide-modified phthaloyl acrylate, 0.05 part of hydroquinone and 15 parts of maleic anhydride-modified liquid polybutadiene (M 2000-20; a product of Nippon Petrochemicals Co., Ltd.). 30 parts of the compound (D) used in Example 11 was added thereto under stirring and heating at 110° C. The mixture was stirred at 165° C. for 2 h to obtain a homogeneous solution. 1.5 parts of benzil dimethyl ketal was dissolved therein to obtain a photosensitive printing plate material, from which a printing plate was prepared in the same manner as in Example 7. The plate had a Shore A hardness of 55. This plate was a flexographic printing plate having a good printability with a water ink, alcohol ink, propyl acetate/ethanol mixture solvent ink or oil ink.

EXAMPLE 16

10 parts of the same polyether esteramide as in Example 7 was mixed with 35 parts of ethylene oxide-modified phthaloyl acrylate, 5 parts of oligomer urethane diacrylate (UV-2000 B), 10 parts of a liquid polybutadiene having acryloyl groups at both ends thereof (R45ACR-LC; a product of Idemitsu Petrochemical Co., Ltd.), 15 parts of a monoacrylate of the following formula:

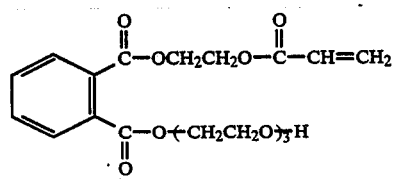

25 parts of the compound (B) as used in Example 9 and 0.05 part of hydroquinone under stirring and heating at 160° C. to obtain a solution. 1.5 parts of benzil dimethyl ketal was dissolved in the solution. A printing plate was prepared from the solution in the same manner as in Example 7. This plate had a Shore A hardness of 57 and good printability with a water, alcohol or oil ink.

EXAMPLE 17

A printing plate was prepared in the same manner as in Example 16 except that 10 parts of the liquid polybutadiene modified with acryloyl groups at both ends (R45ACR-LC) was replaced with 10 parts of a liquid polybutadiene (Nisseki Polybutadiene B1000; a product of Nippon Petrochemicals Co., Ltd., having a number-average molecular weight of about 1000). Though the image-reproducibility of the relief of the printing plate was slightly inferior to that obtained in Example 16, other properties thereof were almost similar to those obtained in Example 16.

EXAMPLE 18

The same procedure as in Example 16 was repeated except that 10 parts of the liquid polybutadiene modified with acryloyl groups at both ends was replaced with 10 parts of liquid polyisoprene (Kuraprene LIR-30; a product of Kuraray Isoprene Chemical Co., Ltd., having a number-average molecular weight of about 9,000). The results were almost the same as in Example 17.

EXAMPLE 19

55 parts of an equimolar salt of αω-diaminopolyoxyethylene and adipic acid (obtained by adding acrylonitrile to both ends of polyoxyethylene having a number-average molecular weight of 600 and reducing the product with hydrogen), 25 parts of ε-caprolactam and 20 parts of a salt of m-xylylenediamine and adipic acid were subjected to melt polymerization under ordinary conditions to obtain a polyamide having a relative viscosity (determined by dissolving 1 g of the polymer in 100 ml of chloral hydrate and measuring the viscosity at 25° C.) of 2.15. The same experiments as in Example 7 were conducted except that 15 parts of the polyether esteramide was replaced with 15 parts of the polyamide thus obtained. The solution had a viscosity of 300 P at 120° C. A solid flexible printing plate material was prepared from the solution by a solvent-free direct casting molding method.

The same negative films as in Example 1 were vacuum-adhered to the material thus obtained. It was exposed to a light from a high-pressure mercury lamp for 3 min and then developed with a brush-type developing apparatus containing neutral water (water temperature: 30° C.). After the development for 2 min, a relief image having a depth of 500 μ was formed.

The obtained relief image was examined to reveal that up to 14 steps remained in the gray-scale portion and that an excellent reproducibility was exhibited in the printing area. The printing plate had a Shore A hardness of 75. The degrees of swelling of the printing plate were 6.3 wt. % in the immersion in ethanol, and 12.5 wt. % in the immersion in ethanol/ethyl acetate (weight ratio: 70/30). In the printing tests with an alcohol ink, excellent prints were obtained.

EXAMPLE 20

15 parts of an alcohol-soluble copolymer polyamide (GOL842 of Toray Industries, Inc.; a nylon 6/66/6.10/12 copolymer) was dissolved in a mixture of 35 parts of N,N-dimethylacrylamide, 55 parts of caprolactone-modified 2-hydroxyethyl methacrylate, 0.05 part of hydroquinone and 1.5 parts of benzil dimethyl ketal under stirring and heating at 150° C. to obtain a homogeneous solution. A solid printing plate material was prepared from the solution in the same manner as in Example 7. From this material, a printing plate having a developability of 300 μ/min in the development with water/ethanol (weight ratio: 50/50) and a Shore A hardness of 45 was prepared.

EXAMPLE 21

15 parts of a polyether esteramide elastomer (PEBAX 2533; available from Toray Industries, Inc.) was added to a mixture of 60 parts of caprolactone-modified 2-hydroxyethyl methacrylate, 20 parts of ethylene oxide-modified phthaloyl acrylate, 5 parts of urethane acrylate (Goselac UV 3000 B) and 0.05 part of hydroquinone under stirring and heating at 140° C. 1.5 parts of benzil dimethyl ketal was homogeneously dissolved in the solution. A solid photosensitive printing plate material was prepared from the solution in the same manner as in Example 1 and then a printing plate was prepared therefrom in the same manner as in Example 1. Water/ethanol (weight ratio: 55/45) was used as the developer. The printing plate thus obtained was a flexographic one having a Shore A hardness of 50 and an excellent printability with water ink.

EXAMPLE 22

23 parts of an alcohol-soluble copolymer polyamide (CM 8000; a nylon 6/66/6.10/12 copolymer produced by Toray Industries, Inc.) was dissolved in a mixture of 77 parts of N,N-dimethylacrylamide and 0.05 part of hydroquinone under stirring and heating at 150° C. to obtain a homogeneous solution. 1.5 parts of benzil dimethyl ketal was dissolved therein. A solid printing plate material was prepared from the solution in the same manner as in Example 20. From this material, a hard printing plate developable with water/ethanol (weight ratio: 55/45) and having a Shore D hardness of 50 or higher was prepared.

We claim:

1. A photosensitive polymer composition comprising the following components A, B and C:
    A: 100 parts by weight of ethylenically unsaturated compounds, wherein at least 50 wt. % of the ethylenically unsaturated compounds is one having the following general formulae:

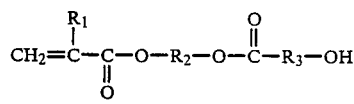

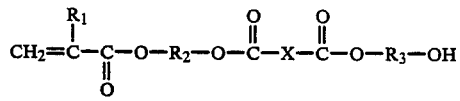

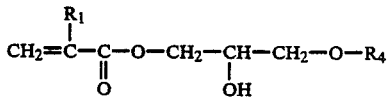

wherein $R_1$ represents H or $CH_3$, $R_2$ represents

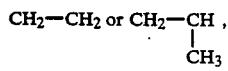

$R_3$ represents an alkylene group having 2 to 6 carbon atoms, $R_4$ represents an alkyl group having 4 to 14 carbon atoms or a phenyl group unsubstituted or substituted with an alkyl group having 1 to 8 carbon atoms, and X represents a dicarboxylic acid residue having 4 to 12 carbon atoms;
    B. 3 to 30 parts by weight of a polyamide soluble in the ethylenically unsaturated compounds; and
    C. 0.01 to 10 parts by weight of a photopolymerization initiator.

2. A photosensitive polymer composition according to claim 1, wherein at least a part of the ethylenically unsaturated compounds is an oligomer urethane acrylate or methacrylate.

3. A photosensitive polymer composition according to claim 1 or 2, wherein at least a part of the ethylenically unsaturated compounds has a substituted or unsubstituted benzene nucleus structure.

4. A photosensitive polymer composition according to claim 3, wherein at least 50 wt. % of the ethylenically unsaturated compounds comprises a compound having a substituted or unsubstituted benzene nucleus structure in the molecule.

5. A photosensitive polymer composition according to claim 1, wherein the polyamide soluble in the ethylenically unsaturated compounds is an alcohol-soluble polyamide.

6. A photosensitive polymer composition according to claim 5, wherein the polyamide soluble in the ethylenically unsaturated compound is a polyamide having a polyether segment.

7. A photosensitive polymer composition according to claim 5, wherein the polyamide soluble in the ethylenically unsaturated compound is an N-alkoxymethylated polyamide.

8. A photosensitive polymer composition according to claim 1, wherein at least a part of the polyamide soluble in the ethylenically unsaturated compound has a substituted or unsubstituted benzene nucleus structure.

9. A photosensitive polymer composition according to claim 21, which further contains a plasticizer.

10. A photosensitive polymer composition according to claim 9, wherein at least a part of the plasticizer comprises a compound having at least one tertiary amine structure and one hydroxyl group in the molecule.

11. A photosensitive polymer composition according to claim 9, wherein at least a part of the plasticizer comprises a compound having a substituted or unsubstituted benzene nucleus structure.

12. A photosensitive polymer composition comprising the following components A, B and C:
A. 100 parts by weight of ethylenically unsaturated compounds, wherein at least 50 wt. % of the ethylenically unsaturated compounds is one having the following general formulae:

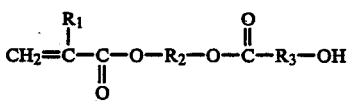

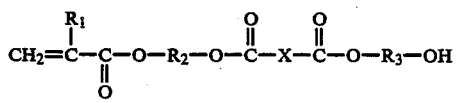

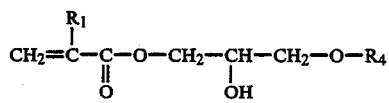

wherein $R_1$ represents H or $CH_3$, $R_2$ represents

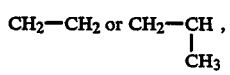

$R_3$ represents an alkylene group having 2 to 6 carbon atoms, $R_4$ represents an alkyl group having 4 to 14 carbon atoms or a phenyl group unsubstituted or substituted with an alkyl group having 1 to 8 carbon atoms, and X represents a dicarboxylic acid residue having 4 to 12 carbon atoms;
B. 3 to 27 parts by weight of a polyesteramide soluble in the ethylenically unsaturated compounds; and
C. 0.01 to 10 parts by weight of a photopolymerization initiator.

13. A photosensitive polymer composition according to claim 12, wherein at least a part of the ethylenically unsaturated compounds is an oligomer urethane acrylate or methacrylate.

14. A photosensitive polymer composition according to claim 12 or 13, wherein at least a part of the ethylenically unsaturated compounds has a substituted or unsubstituted benzene nucleus structure.

15. A photosensitive polymer composition according to claim 14, wherein at least 50 wt. % of the ethylenically unsaturated compounds comprises a compound having a substituted or unsubstituted benzene nucleus structure in the molecule.

16. A photosensitive polymer composition according to claim 11, wherein the polyesteramide soluble in the ethylenically unsaturated compounds in an alcohol-soluble polyesteramide.

17. A photosensitive polymer composition according to claim 16, wherein the polyesteramide soluble in the ethylenically unsaturated compound is a polyesteramide having a polyether segment.

18. A photosensitive polymer composition according to claim 17, wherein the polyesteramide soluble in the ethylenically unsaturated compound is an N-alkoxymethylated polyesteramide.

19. A photosensitive polymer composition according to claim 11, wherein at least a part of the polyesteramide soluble in the ethylenically unsaturated compound has a substituted or unsubstituted benzene nucleus structure.

20. A photosensitive polymer composition according to claim 11, which further contains a plasticizer.

21. A photosensitive polymer composition according to claim 20, wherein at least a part of the plasticizer comprises a compound having at least one tertiary amine structure and one hydroxyl group in the molecule.

22. A photosensitive polymer composition according to claim 21, wherein at least a part of the plasticizer comprises a compound having a substituted or unsubstituted benzene nucleus structure.

23. A solid photosensitive printing plate material comprising the following components A, B and C and a support:
A: 100 parts by weight of ethylenically unsaturated compounds, wherein at least 50 wt. % of the ethylenically unsaturated compounds is one having the general formula:

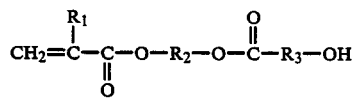

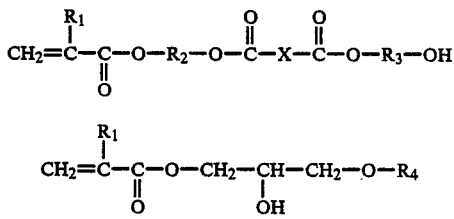

wherein $R_1$ represents H or $CH_3$, $R_2$ represents

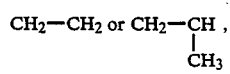

$R_3$ represents an alkylene group having 2 to 6 carbon atoms, $R_4$ represents an alkyl group having 4 to 14 carbon atoms or a phenyl group unsubstituted or substituted with an alkyl group having 1 to 8 carbon atoms, and X represents a dicarboxylic acid residue having 4 to 12 carbon atoms;
B: 3 to 40 parts by weight of a polyamide soluble in the ethylenically unsaturated compounds and
C: 0.01 to 10 parts by weight of a photopolymerization initiator.

24. A solid photosensitive printing plate material according to claim 23, which is developable with water and/or an alcohol.

25. A solid photosensitive printing plate material according to claim 23 or 24, which gives a printing plate having a Shore A hardness in the range of 20 to 90 and which is printable with a water ink or an alcohol ink.

26. A solid photosensitive printing plate material comprising the following components A, B and C and a support:
A: 100 parts by weight of ethylenically unsaturated compounds, wherein at least 50 wt. % of the ethylenically unsaturated compounds is one having the general formula:

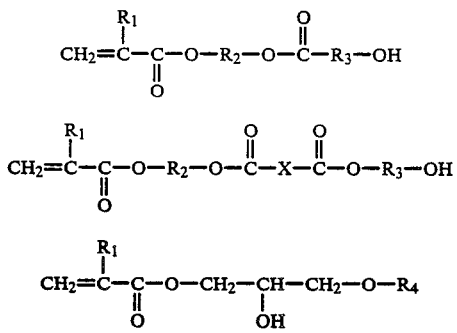

wherein $R_1$ represents H or $CH_3$, $R_2$ represents

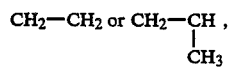

$R_3$ represents an alkylene group having 2 to 6 carbon atoms, $R_4$ represents an alkyl group having 4 to 14 carbon atoms or a phenyl group unsubstituted or substituted with an alkyl group having 1 to 8 carbon atoms, and X represents a dicarboxylic acid residue having 4 to 12 carbon atoms;

B: 3 to 32 parts by weight of a polyesteramide soluble in the ethylenically unsaturated compounds and C: 0.01 to 10 parts by weight of a photopolymerization initiator.

27. A solid photosensitive printing plate material according to claim 26, which is developable with water and/or an alcohol.

28. A solid photosensitive printing plate material according to claim 26, which gives a printing plate having a Shore A hardness in the range of 20 to 90 and being printable with a water ink or an alcohol ink.

29. A photosensitive polymer composition comprising the following components A, B and C:

A: 100 parts by weight of ethylenically unsaturated compounds containing 1 to 70 wt. % of polyene compound having a molecular weight of 500 to 20,000;

B: 3 to 40 parts by weight of a polyamide soluble in the ethylenically unsaturated compounds; and C: 0.01 to 10 parts by weight of a photopolymerization initiator.

30. A photosensitive polymer composition comprising the following components A, B and C:

A: 100 parts by weight of ethylenically unsaturated compounds containing 1 to 70 wt. % of polyene compound having a molecular weight of 500 to 20,000;

B: 3 to 32 parts by weight of a polyesteramide soluble in the ethylenically unsaturated compounds; and C: 0.01 to 10 parts by weight of a photopolymerization initiator.

31. A photosensitive polymer composition comprising the following components A, B, C and D:

A: 100 parts by weight of ethylenically unsaturated compounds;

B: 3 to 40 parts by weight of a polyamide soluble in the ethylenically unsaturated compounds;

C: 0.01 to 10 parts by weight of a photopolymerization initiator; and

D: up to 30 parts by weight of a compound having at least one hydroxyl group and at least one tertiary amine and having a number-average molecular weight of 700 to 4000.

32. A photosensitive polymer composition comprising the following components A, B, C and D:

A: 100 parts by weight of ethylenically unsaturated compounds;

B: 3 to 32 parts by weight of a polyesteramide soluble in the ethylenically unsaturated compounds;

C: 0.01 to 10 parts by weight of a photopolymerization initiator; and

D: up to 30 parts by weight of a compound having at least one hydroxyl group and at least one tertiary amine and having a number-average molecular weight of 700 to 4000.

* * * * *